(12) United States Patent
Nam

(10) Patent No.: US 12,193,216 B2
(45) Date of Patent: Jan. 7, 2025

(54) SEMICONDUCTOR DEVICE HAVING BURIED GATE STRUCTURE AND METHOD FOR FABRICATING THE SAME

(71) Applicant: SK hynix Inc., Gyeonggi-do (KR)

(72) Inventor: Yoon Jae Nam, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 320 days.

(21) Appl. No.: 17/719,939

(22) Filed: Apr. 13, 2022

(65) Prior Publication Data

US 2023/0095446 A1    Mar. 30, 2023

(30) Foreign Application Priority Data

Sep. 29, 2021    (KR) .................. 10-2021-0128902

(51) Int. Cl.
*H10B 12/00*    (2023.01)
(52) U.S. Cl.
CPC ........... *H10B 12/34* (2023.02); *H10B 12/053* (2023.02)
(58) Field of Classification Search
None
See application file for complete search history.

(56) References Cited

U.S. PATENT DOCUMENTS

| | | | |
|---|---|---|---|
| 8,835,259 B2 | 9/2014 | Jang | |
| 9,589,960 B1 * | 3/2017 | Min | H01L 29/66621 |
| 2016/0315088 A1 * | 10/2016 | Kang | H01L 29/513 |
| 2017/0179253 A1 * | 6/2017 | Cha | H01L 29/7833 |
| 2022/0336638 A1 * | 10/2022 | Han | H01L 21/823412 |

* cited by examiner

*Primary Examiner* — Hsien Ming Lee
(74) *Attorney, Agent, or Firm* — IP & T GROUP LLP

(57) ABSTRACT

A semiconductor device includes a substrate including an active region defined by an isolation layer; a buried gate structure provided in a trench formed in the substrate; and a first doped region and a second doped region formed in the active region and separated by the trench, wherein the buried gate structure includes a gate dielectric layer conformally covering the trench; and a gate electrode including a first portion partially filling the trench on the gate dielectric layer and a second portion formed on the first portion, wherein the second portion includes a material included in the first portion and dopants including phosphorous (P), germanium (Ge), or a combination thereof, and wherein the first portion does not laterally overlap with the doped region and the second doped region, and all or a part of the second portion laterally overlaps with the first doped region and the second doped region.

19 Claims, 22 Drawing Sheets

SEMICONDUCTOR DEVICE HAVING BURIED GATE STRUCTURE AND METHOD FOR FABRICATING THE SAME

CROSS-REFERENCE TO RELATED APPLICATIONS

The present application claims priority to Korean Patent Application No. 10-2021-0128902, filed on Sep. 29, 2021, which is incorporated herein by reference in its entirety.

BACKGROUND

1. Field

Various embodiments relate generally to a semiconductor device, and particularly, to a semiconductor device having a buried gate structure and a method for fabricating the same.

2. Description of the Related Art

A metal gate electrode is applied for high performance of a transistor. Particularly, a buried gate type transistor requires control of a threshold voltage for a high-performance operation. In addition, gate induced drain leakage (GIDL) characteristics greatly affect the performance of the buried gate type transistor.

SUMMARY

Various embodiments of the present invention are directed to a semiconductor device that may prevent gate induced drain leakage (GIDL), improve refresh characteristics while also maintaining a high threshold voltage at a region in contact with a channel. Various embodiments of the present invention are directed to a method for fabricating the semiconductor device.

In accordance with an embodiment, a semiconductor device may include: a substrate including an active region defined by an isolation layer; a buried gate structure provided in a trench formed in the substrate; and a first doped region and a second doped region formed in the active region and separated by the trench, wherein the buried gate structure includes a gate dielectric layer conformally covering the trench; and a gate electrode including a first portion partially filling the trench on the gate dielectric layer and a second portion formed on the first portion, wherein the second portion includes a material included in the first portion and dopants including phosphorous (P), germanium (Ge), or a combination thereof, and wherein the first portion does not laterally overlap with the doped region and the second doped region, and all or a part of the second portion laterally overlaps with the first doped region and the second doped region In accordance with an embodiment, a method for fabricating a semiconductor device may include: forming a trench in a substrate including an active region defined by an isolation layer; forming a gate dielectric layer covering the trench; forming an initial gate electrode partially filling the trench on the gate dielectric layer; forming a gate electrode including a first portion and a second portion; and forming a first doped region and a second doped region on both sides of the trench, wherein the second portion differs from the first portion in that only the second portion includes at least one dopant.

DETAILED DESCRIPTION

Figure 1:
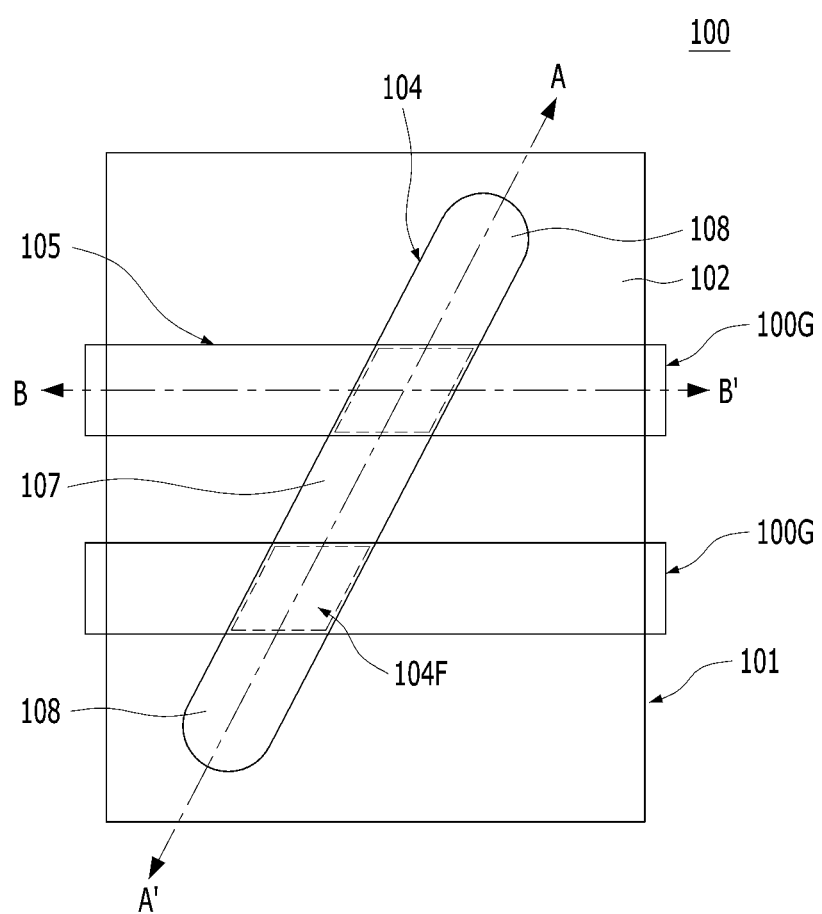
FIG. 1 is a plane view illustrating a semiconductor device in accordance with an embodiment of the present invention.

Various embodiments described herein may be described with reference to cross-sectional views, plane views and block diagrams, which are ideal schematic views of the semiconductor device according to specific embodiments of the present invention. It is noted that the structures of the drawings may be modified by fabricating techniques and/or tolerances. The present invention is not limited to the described embodiments and the specific structures shown in the drawings, but may include other embodiments, or modifications of the described embodiments including any changes in the structures that may be produced according to requirements of the fabricating process. Accordingly, the regions illustrated in the drawings have schematic attributes, and the shapes of the regions illustrated in the drawings are intended to illustrate specific structures of regions of the elements, and are not intended to limit the scope of the invention.

Figure 2A:
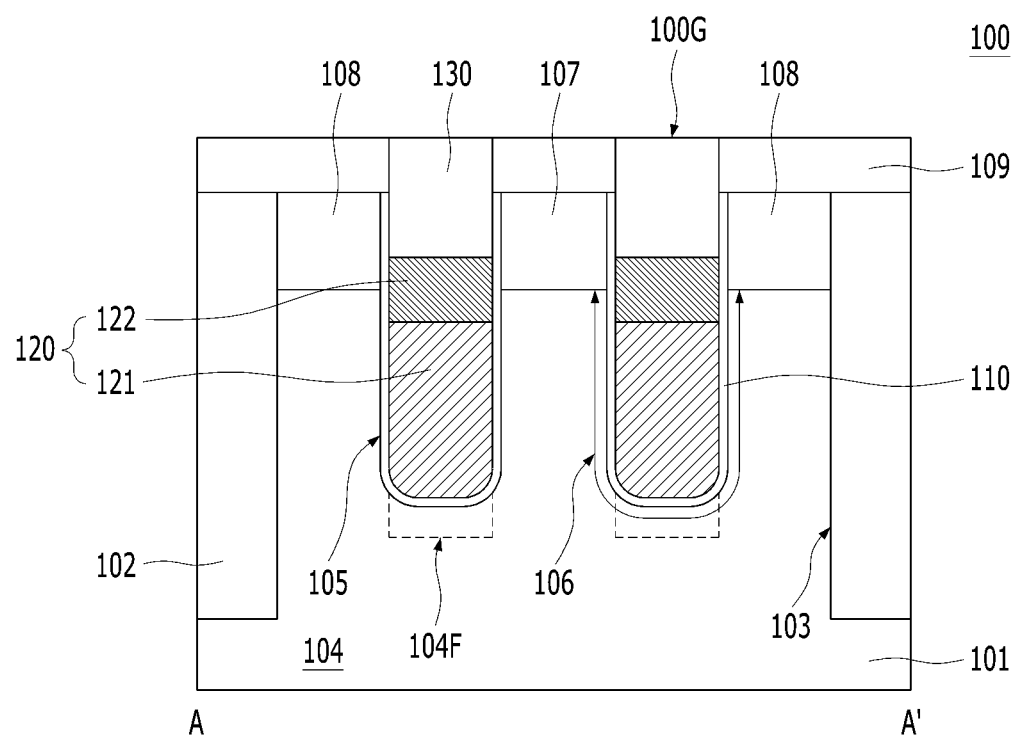
FIG. 2A is a cross-sectional view illustrating the semiconductor device taken along line A-A' illustrated in FIG. 1.
Figure 2B:
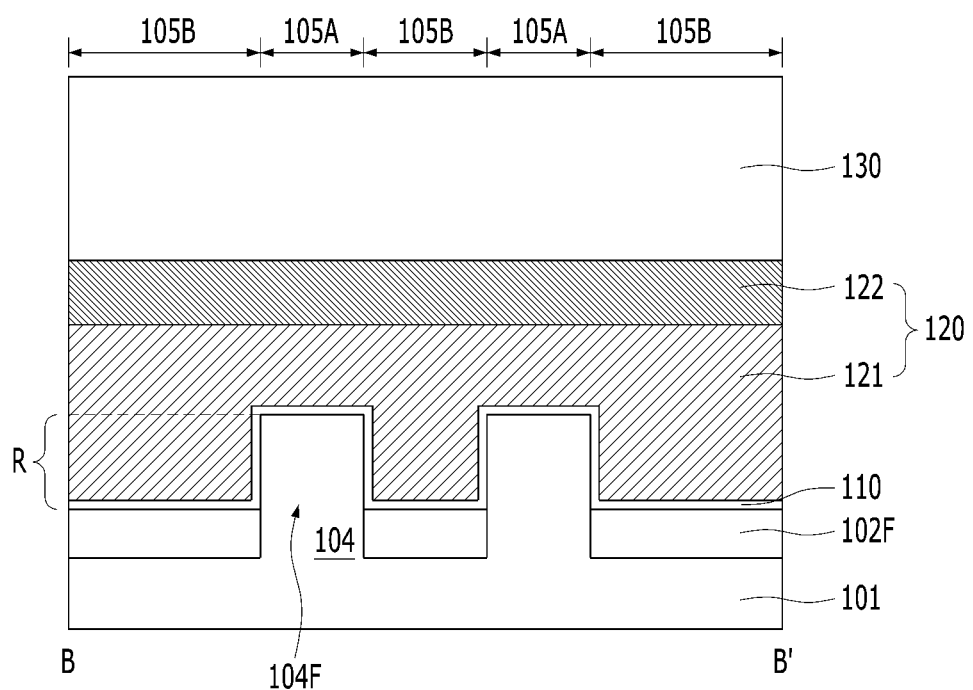
FIG. 2B is a cross-sectional view illustrating the semiconductor device taken along line B-B' illustrated in FIG. 1.

FIG. 1 is a plane view illustrating a semiconductor device 100 in accordance with an embodiment of the present invention. FIG. 2A is a cross-sectional view illustrating the semiconductor device 100 taken along A-A' line illustrated in FIG. 1. FIG. 2B is a cross-sectional view illustrating the semiconductor device 100 taken along B-B' line illustrated in FIG. 1.

Referring to FIGS. 1, 2A and 2B, the semiconductor device 100 may include a substrate 101, an isolation layer 102, an active region 104, an isolation trench 103, a gate trench 105, a buried gate structure 100G, a channel region 106, a first doped region 107, a second doped region 108 and a hard mask layer 109. The semiconductor device 100 may be a part of a memory cell. For example, the semiconductor device 100 may be a part of a memory cell of a DRAM.

The substrate 101 may be a material suitable for semiconductor processing. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, combinations thereof or multi-layers thereof. The substrate 101 may include another semiconductor material, such as germanium. The substrate 101 may include a III/V-group semiconductor substrate, for example, a chemical compound semiconductor substrate such as gallium arsenide (GaAs). The substrate 101 may include a Silicon-On-Insulator (SOI) substrate.

The isolation layer 102 and the active region 104 may be formed in the substrate 101.

The active region 104 may be defined by the isolation layer 102 and provide regions where electronic devices are formed.

The isolation layer 102 may be a Shallow Trench Isolation (STI) region formed by trench etching. The isolation layer 102 may electrically separate the active region 104 from each other and fill a region between the active regions 104. The isolation layer 102 may be formed by filling a shallow trench, for example, the isolation trench 103, with a dielectric material. The isolation layer 102 may include silicon oxide, silicon nitride or a combination thereof.

The gate trench 105 may be formed in the substrate 101.

The gate trench 105 is a space in which the buried gate structure 100G is formed. Referring to FIG. 1, the gate trench 105 may have a line shape extended in any one direction. The gate trench 105 may have a line shape crossing the active region 104 and the isolation layer 102. The gate trench 105 may have a shallower depth than the isolation trench 103. In an embodiment, the gate trench 105 may have a bottom portion (also referred to herein as a bottom surface) which has a curvature and an upper portion which includes opposite, first and second sidewalls. The sidewalls of the gate trench 105 may be slightly curved at an edge portion thereof connecting with the bottom portion of the gate trench 105. The sidewalls of the gate trench 105 may be vertical or substantially vertical to the top surface of the substrate. In some other embodiments, the gate trench 105 may have a bottom portion (also referred to herein as a bottom surface) which is substantially flat and parallel to a top surface of the substrate 101. The edges of the bottom portion of the gate trench 105 may be curved to provide a smooth transition between the vertical sidewalls and the flat bottom portion. The sidewalls of the trench may be slightly curved at an edge portion thereof connecting with the bottom portion of the gate trench 105.

The gate trench 105 may include a first trench 105A and a second trench 105B.

The first trench 105A may be formed in the active region 104. The second trench 105B may be formed in the isolation layer 102. The gate trench 105 may have a shape that is continuously extended from the first trench 105A to the second trench 105B. In the gate trench 105, the bottom surfaces of the first and second trenches 105A and 105B may be located at different levels. For example, the bottom surface of the first trench 105A may be located at a higher level than the bottom surface of the second trench 105B. A difference in height between the first trench 105A and the second trench 105B may be formed as the isolation layer 102 is recessed. Thus, the second trench 105B may include a recessed region R having a bottom surface that is lower than the bottom surface of the first trench 105A. A fin region 104F may be formed in the active region 104 due to the step change in depth between the first trench 105A and the second trench 105B. Thus, the active region 104 may include the fin region 104F.

As such, the sidewalls of the fin region 104F are exposed by a recessed isolation layer 102F. The top surface of the fin region 104F may be located at a higher level than the top surface of the recessed isolation layer 102F. The fin region 104F is a region in which a part of the channel region 106 may be formed. The fin region 104F may increase the channel width and improve the electrical characteristics.

In some embodiments, the fin region 104F may be omitted.

The channel region 106, the first doped region 107 and the second doped region 108 may be formed in the active region 104.

The channel region 106 may be defined in the active region 104 between the first doped region 107 and the second doped region 108. The channel region 106 may be defined according to the profile of the gate trench 105. For example, the channel region 106 may be formed in a U-shape between the first doped region 107 and the second doped region 108.

Since the channel region 106 has a longer channel length than that of a conventional planar-type transistor, a short channel effect can be prevented.

The channel region 106 may be formed by performing a channel doping in the active region 104 between the first doped region 107 and the second doped region 108. At this time, due to the high aspect ratio of the gate trench 105, it may be difficult to sufficiently dope the bottom region of the gate trench 105 or the fin region 104F by a common channel doping which is performed on the entire channel region 106. Accordingly, after the channel doping, local channel doping may be further performed on the bottom region of the gate trench 105 or the fin region 104F. The local channel doping may refer to a channel doping which is performed locally on a part of the channel region 106. When ion implantation is applied as the local channel doping, it is referred to as local channel ion implantation (LCI). In another embodiment, the channel doping may be omitted.

The first and second doped regions 107 and 108 may be regions doped with conductive dopants and may serve as a source region and a drain region, respectively. The first and second doped regions 107 and 108 may be formed in the active region 104 on both sides of the gate trench 105 and separated from each other by the gate trench 105. The bottom surfaces of the first and second doped regions 107 and 108 may be located at a predetermined depth from the top surface of the active region 104. The first and second doped regions 107 and 108 may be located at a higher level than the bottom surface of the gate trench 105. The first and second doped regions 107 and 108 may be in contact with the sidewalls of the gate trench 105. The first and second doped regions 107 and 108 may form a junction having a same depth as each of the doped regions 107 and 108. The bottom surfaces of the first and second doped regions 107 and 108 may be located at a level higher than the bottom surface of a second portion 122 of a gate electrode 120 as illustrated in FIG. 2A. However, the embodiment may be modified, without departing from the scope of the disclosed invention, to allow that the bottom surfaces of the first and second doped regions 107 and 108 may be located at a same level as a bottom surface of a second portion 122 of a gate electrode 120. The first and second doped regions 107 and 108 may overlap with the second portion 122 of the gate electrode 120 wherein the term 'overlapping' here means laterally overlapping. More specifically, as shown in FIG. 2A, the bottom surface of the second portion 122 may be at a level lower than the bottom surfaces of the first and second doped regions 107 and 108, and the top surface of the second portion 122 may be at a level higher than the bottom surfaces of the first and second doped regions 107 and 108 but at a lower level than the top surfaces of the first and second doped regions 107 and 108.

The first and second doped regions 107 and 108 may be doped with conductive dopants. For example, the conductive dopants may include phosphorus (P), arsenic (As), antimony (Sb) or boron (B). The first and second doped regions 107 and 108 may be doped with the same conductive dopant. The first and second doped regions 107 and 108 may be formed by doping dopants by tilted ion implantation. The formation of the first and second doped regions 107 and 108 will be described in detail below with reference to FIGS. 4A to 4G, 5A to 5G, and 6A to 6C.

The semiconductor device 100 may include the buried gate structure 100G. The buried gate structure 100G may be filled in the gate trench 105. The buried gate structure 100G may include a gate dielectric layer 110, the gate electrode 120 and a capping layer 130.

The gate dielectric layer 110 may be formed so as to conformally cover the inner surface of the gate trench 105, that is, cover the bottom surface and sidewalls of the gate trench 105. The gate dielectric layer 110 may be in contact with the active region 104 and the isolation layer 102. The gate dielectric layer 110 may be provided on the fin region 104F. The gate dielectric layer 110 may cover the top surface and sidewalls of the fin region 104F.

The gate dielectric layer 110 may include silicon oxide, silicon nitride, silicon oxynitride, a high-k material or combinations thereof. The high-k material may be or include a material having a higher dielectric constant than silicon oxide. For example, the high-k material may be or include any suitable material having a dielectric constant higher than 3.9. In an embodiment, the high-k material may be or include any suitable material having a dielectric constant higher than 10. In an embodiment, the high-k material may be or include any suitable material having a dielectric constant ranging from 10 to 30. The high-k material may be or include at least one metallic element. The high-k material may be or include a hafnium-containing material. The hafnium-containing material may be or include hafnium oxide, hafnium silicon oxide, hafnium silicon oxynitride or combinations thereof. In an embodiment, the high-k material may be or include lanthanum oxide, lanthanum aluminum oxide, zirconium oxide, zirconium silicon oxide, zirconium silicon oxynitride, aluminum oxide or combinations thereof. As the high-k material, other publicly-known high-k materials may also be selectively used. The gate dielectric layer 110 may be or include metal oxide. In an embodiment, the gate dielectric layer 110 may be formed by oxidizing the surface of the gate trench 105. In another embodiment, the gate dielectric layer 110 may include silicon oxide formed by oxidizing liner polysilicon. In further another embodiment, the gate dielectric layer 110 may include silicon oxide formed by oxidizing liner nitride.

The gate electrode 120 may partially fill the gate trench 105 on the gate dielectric layer 110. The top surface of the gate electrode 120 may be located at a lower level than that of the top surface of the active region 104. The gate electrode 120 may include a first portion 121 and a second portion 122. The gate electrode 120 will be described in detail below.

The capping layer 130 may serve to protect the gate electrode 120. The capping layer 130 may fill the upper portion of the gate trench 105. The top surface of the capping layer 130 may be located at the same level as the top surfaces of the first and second doped regions 107 and 108.

The capping layer 130 may include a dielectric material. The capping layer 130 may include silicon nitride, silicon oxynitride or a combination thereof. In an embodiment, the capping layer 130 may include a combination of silicon nitride and silicon oxide. The capping layer 130 may include a silicon nitride liner and a Spin-On-Dielectric (SOD) material. The capping layer 130 may include an Oxide-Nitride-Oxide (ONO) structure.

A hard mask layer 109 may be formed on both sides of the capping layer 130. The hard mask layer 109 may include a dielectric material. The hard mask layer 109 may be formed on the substrate 101, and cover the active region 104 and the isolation layer 102. The hard mask layer 109 may be in direct contact with the active region 104 and the isolation layer 102.

The gate electrode 120 will be described in detail below.

In an embodiment, a work function of the second portion 122 of the gate electrode 120 can be appropriately modulated while maintaining a work function of the first portion 121 of the gate electrode 120. Thus, it is possible to prevent a gate induced drain leakage (GIDL) at a region in contact with a junction region and maintain a threshold voltage (Vt) at a region in contact with the channel. That is, although the gate electrode 120 may be formed of a low-resistance material to decrease the gate sheet resistance, it is possible to prevent a gate induced drain leakage (GIDL) at a region in contact with the first and second doped regions 107 and 108 and improve refresh characteristics by modulating a work function of the second portion 122 of the gate electrode 120, and at the same time, maintain a high threshold voltage by maintaining a work function of the first portion 121 of the gate electrode 120.

The gate electrode 120 may include the first portion 121 and the second portion 122. The first portion 121 may be a portion where a work function is not modulated. The first and second portions 121 and 122 may be formed by modulating a work function of the second portion 122 after forming the first and second portions 121 and 122 with a material of the gate electrode 120. Accordingly, the first portion 121 may have a work function of the material of the gate electrode 120 and the second portion 122 may have a work function lower than that of the material of the gate electrode 120. That is, the work function of the second portion 122 may be lower than that of the first portion 121. The first portion 121 may be referred to as a high work function portion and the second portion 122 may be referred to as a low work function portion.

The first portion 121 may fill a lower portion of the gate trench 105 on the gate dielectric layer 110. The second portion 122 may fill an upper portion of the gate trench 105 on the gate dielectric layer 110 and be formed on the first portion 121. The first portion 121 may laterally overlap with the channel region 106. All or a part of the second portion 122 may laterally overlap with the first and second doped regions 107 and 108. The top surface of the second portion 122 may be located at a lower level than the top surface of the active region 104. The bottom surface of the second portion 122 may be located at the same level as or a lower level than the bottom surface of the first and second doped regions 107 and 108.

The first portion 121 may be or include a low resistivity material in order to decrease gate sheet resistance. The first portion 121 may be or include a metal-based material. The first portion 121 may be or include a metal, metal nitride or a combination thereof. The first portion 121 may be or include tantalum nitride (TaN), titanium nitride (TiN), tungsten (W), aluminum (Al), tungsten nitride (WN), tungsten silicide ($WSi_x$), cobalt silicide ($CoSi_x$), titanium silicide ($TiSi_x$) or combinations thereof. In an embodiment, the first portion 121 may be formed of titanium nitride only. A work function of the first portion 121 may not be modulated. The first portion 121 may have an intrinsic work function of a material forming the first portion 121. It is possible to maintain a high threshold voltage without decreasing the threshold voltage.

The first portion 121 may have a higher height than the second portion 122. Accordingly, the volume occupied by the first portion 121 in the gate trench 105 may be greater than that of the second portion 122. Sidewalls of the first and second portions 121 and 122 may be aligned with each other. Therefore, the first portion 121 may have the same width as the second portion 122.

The second portion 122 may be a region where a work function is modulated by an ion implantation. The second portion 122 may include the same material as the first portion 121 and dopants for modulating a work function. That is, by forming an initial gate electrode and then performing an ion implantation process on an upper portion of the initial gate electrode, the first portion 121 having no dopants and the second portion 122 having dopants over the first portion 121 may be formed.

Since the second portion 122 has a reduced work function by modulating a work function, it is possible to prevent GIDL occurring at a region in contact with the first and second doped regions 107 and 108 and improve refresh characteristics. At the same time, since a high work function of the first portion 121 is not decreased, it is possible to prevent a decrease in the threshold voltage at a lower region of the gate electrode 120 in contact with the channel region 106.

The dopants incorporated into the second portion 122 by an ion implantation may include phosphorous (P), germanium (Ge), or a combination thereof.

In an embodiment, the dopants incorporated into the second portion 122 may be the same as the dopants incorporated into the first and second doped regions 107 and 108. For example, the dopants incorporated into the second portion 122 and the first and second doped regions 107 and 108 may include phosphorous (P).

In another embodiment, the dopants incorporated into the second portion 122 may be different from the dopants incorporated into the first and second doped regions 107 and 108. For example, the dopants incorporated into the second portion 122 may include phosphorous (P), and the dopants incorporated into the first and second doped regions 107 and 108 may include arsenic (As). For another example, the dopants incorporated into the second portion 122 may include germanium (Ge), and the dopants incorporated into the first and second doped regions 107 and 108 may include phosphorous (P). For further another example, the dopants incorporated into the second portion 122 may include germanium (Ge), and the dopants incorporated into the first and second doped regions 107 and 108 may include arsenic (As).

Characteristics of the gate electrode 120 will be described in more detail with reference to FIG. 3.

Figure 3:
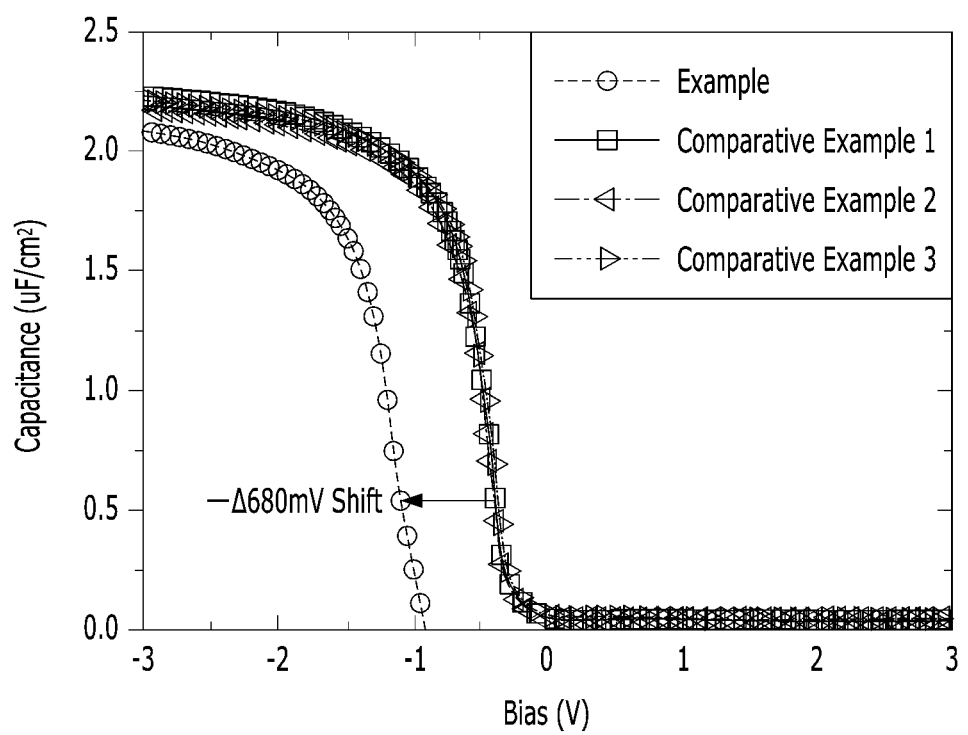
FIG. 3 is a graph illustrating capacitance-bias ("C-V") characteristics of transistors in accordance with an embodiment of the present invention and comparative examples.

FIG. 3 is a graph illustrating C-V characteristics of transistors in accordance with an embodiment of the present invention and comparative examples. Comparative Example 1 illustrates C-V characteristics of a transistor having a gate electrode formed of TiN alone, Comparative Examples 2 and 3 illustrate C-V characteristics of transistors having a gate electrode formed by ion implantation of nitrogen (N) with different ion beam energy into an upper portion of TiN (Ion beam energy of Comparative Example 2 is greater than that of Comparative Example 3). The inventive example of the present invention is referred to in FIG. 3 simply as "Example" and illustrates C-V characteristics of a transistor having a gate electrode formed by ion implantation of phosphorous (P) into an upper portion of TiN.

Referring to FIG. 3, in case of the inventive Example, a flat-band voltage (Vfb) is shifted by about −Δ680 mV in a negative direction, compared with Comparative Examples 1 to 3.

A flat-band voltage may represent a voltage to be applied to the gate electrode in order to realize the flat-band condition and depend on a work function. A high work function may shift a flat-band voltage in a positive direction, and a low work function may shift a flat-band voltage in a negative direction. Also, a flat-band voltage is a component constituting a threshold voltage and thus, a threshold voltage may depend on a flat-band voltage.

As shown in FIG. 3, for the inventive example, a dopant, for example, phosphorous (P) is doped into the upper portion of the gate electrode 120 to form the second portion 122 of the gate electrode 120. Therefore, a work function of the second portion 122 is changed into a low work function, thereby shifting a flat-band voltage in a negative direction. That is, a work function of the second portion 122 is decreased and a threshold voltage is decreased so that a gate induced drain leakage (GIDL) at a region in contact with the first and second doped regions 107 and 108 is prevented and refresh characteristics are improved. Moreover, a work function of the first portion 121 is maintained without being decreased so that a high threshold voltage at a lower region of the gate electrode 120 in contact with the channel region 106 is maintained.

Conventionally, a dual gate including a double stack of different materials has been used in order to improve refresh characteristics of the gate electrode. Such a dual gate may include a low resistance material such as TiN at a lower portion and polysilicon at an upper portion. Since polysilicon has a low work function, refresh characteristics may be improved. However, in this case, there is still a problem due to a high resistance of polysilicon.

In accordance with the embodiments, since the gate electrode is formed by adjusting a work function of the upper portion of the initial gate electrode including a low resistance material such as TiN to a low work function, it is possible to achieve the same or improved effect in comparison with the effect of lowering a work function by polysilicon in a dual gate. Moreover, since the junction region is not in contact with the low resistance material of the lower portion of the gate electrode, it is possible to prevent gate induced drain leakage (GIDL) in a region in contact with the gate junction region and improve refresh characteristics. At the same time, since a work function of the lower portion of the gate electrode is not decreased, a high threshold voltage can be maintained. According to the embodiments, since a plurality of process steps necessary for forming the dual gate can be omitted, it is possible to improve process efficiency.

FIGS. 4A to 4G are cross-sectional views illustrating an example of a method for forming a semiconductor device in accordance with an embodiment of the present invention. FIGS. 4A to 4G illustrate an example of a method for forming the semiconductor device 100 of FIG. 2A.

Figure 4A:
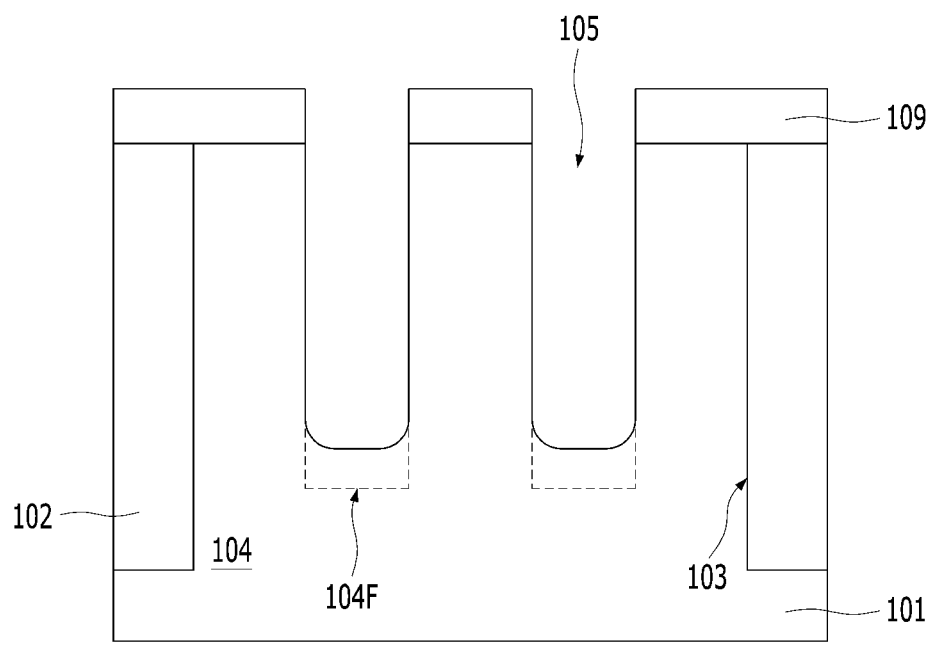
FIGS. 4A to 4G are cross-sectional views illustrating an example of a method for forming a semiconductor device illustrated in FIG. 2A.

Referring to FIG. 4A, an isolation layer 102 may be formed in a substrate 101 to define an active region 104. The isolation layer 102 may be formed using a shallow trench isolation (STI) process. For example, an isolation trench 103 may be formed by etching the substrate 101, and filled with a dielectric material to form the isolation layer 102. The isolation layer 102 may include silicon oxide, silicon nitride or a combination thereof. The isolation trench 103 may be filled with a dielectric material using a deposition process such as, for example, a chemical vapor deposition (CVD) process. Also, a planarization process such as chemicalmechanical polishing (CMP) may be additionally used to remove any excess of the deposited material above the isolation trench 103.

A hard mask layer 109 may be formed on the substrate 101. The hard mask layer 109 may be formed on the substrate 101 and may have a line-shaped opening. The hard mask layer 109 may be formed of a material having an etch selectivity with respect to the material of the substrate 101. The hard mask layer 109 may include a silicon oxide, such as Tetra-Ethyl-Ortho-Silicate (TEOS).

A gate trench 105 may be formed in the substrate 101. The gate trench 105 may have a line shape crossing the active region 104 and the isolation layer 102. The gate trench 105 may be formed by etching the substrate 101 using the hard mask layer 109 as an etch mask.

The gate trench 105 may be formed to be shallower than the isolation trench 13. The gate trench 105 may be sufficiently deep and wide to allow forming a sufficiently large gate electrode 120 having a large average cross-sectional area, which is to be formed subsequently. In this way, the resistance of the gate electrode 120 may be decreased.

In an embodiment, the bottom edges of the gate trench 105 may have a curvature. In this way, by forming the bottom of the gate trench 105 to have a curvature, prominences and depressions may be minimized at the bottom of the gate trench 105, and accordingly, filling of the gate electrode may be easily performed. Also, by forming the bottom of the gate trench 105 to have a curvature, angled corners may be removed at the bottom of the gate trench 105, whereby electric field enhancement may be alleviated.

Subsequently, a fin region 104F may be formed. The fin region 104F may be formed by selectively recessing the isolation layer 102 below the gate trench 105. For the structure of the fin region 104F, the reference is made to the fin region 104F of FIG. 2B.

Figure 4B:
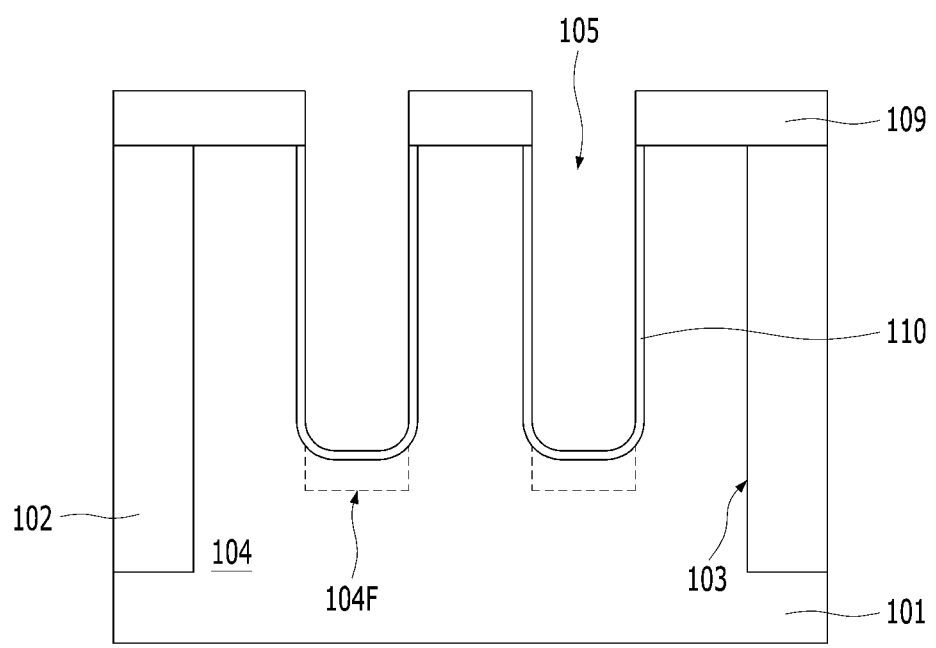

Referring to FIG. 4B, a gate dielectric layer 110 may be formed directly on the surface of the gate trench 105 to conformally cover the entire surface (bottom and sidewalls) of the gate trench 105.

Before the gate dielectric layer 110 is formed, the surface of the gate trench 105 that is damaged from the etch process may be recovered. For example, sacrificial oxide may be formed by a thermal oxidation treatment, and then the sacrificial oxide may be removed.

In an embodiment, the gate dielectric layer 110 may be formed by a thermal oxidation process.

In an embodiment, the gate dielectric layer 110 may be formed by a deposition process, such as a chemical vapor deposition (CVD) process or an atomic layer deposition (ALD) process.

In another embodiment, the gate dielectric layer 110 may be formed by depositing a liner polysilicon layer and then performing a radical oxidization on the liner polysilicon layer.

In another embodiment, the gate dielectric layer 110 may be formed by depositing a liner polysilicon nitride layer and then performing a radical oxidization on the liner polysilicon nitride layer.

The gate dielectric layer 110, which is formed by thermal oxidation, may include silicon oxide. The gate dielectric layer 110, which is formed by the deposition process, may include a high-k material, oxide, nitride, oxynitride or combinations thereof. The high-k material may be or include a hafnium-containing material. The hafnium-containing material may be or include hafnium oxide, hafnium silicon oxide, hafnium silicon oxynitride or combinations thereof. In an embodiment, the high-k material may be or include lanthanum oxide, lanthanum aluminum oxide, zirconium oxide, zirconium silicon oxide, zirconium silicon oxynitride, aluminum oxide or combinations thereof. As the high-k material, other publicly-known high-k materials may also be selectively used. The gate dielectric layer 110 may include a stack of silicon oxide and a high-k material, and the high-k material may be or include a material having a higher areal density of oxygen atoms than the silicon oxide.

Figure 4C:
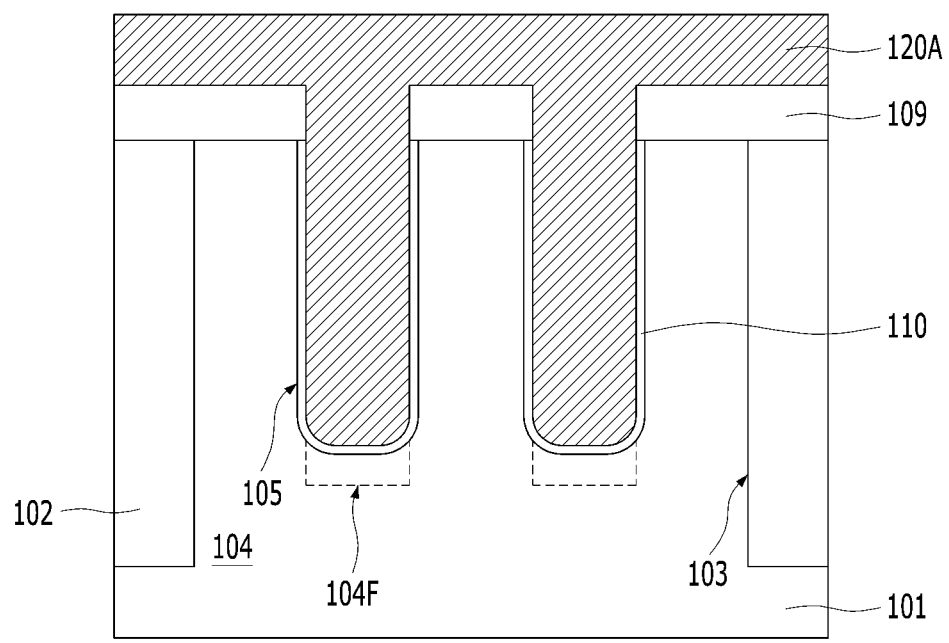

Referring to FIG. 4C, a gate layer 120A may be formed to cover the structure of FIG. 4B. That is, the gate layer 120A may be formed on the gate dielectric layer 110 and the hard mask layer 109.

The gate layer 120A may fill the gate trench 105 and be in direct contact with the gate dielectric layer 110.

The gate layer 120A may be formed by deposition methods including, for example, CVD or ALD. The gate layer 120A may include a low resistivity metal material. The gate layer 120A may include a metal, metal nitride, metal silicide, or a combination thereof. The gate layer 120A may include tantalum nitride (TaN), titanium nitride (TiN), tungsten (W), aluminum (Al), tungsten nitride (WN), tungsten silicide (WSi$_x$), cobalt silicide (CoSi$_x$), titanium silicide (TiSi$_x$), or a combination thereof. In an embodiment, the gate layer 120A may be formed of titanium nitride (TiN) alone.

Figure 4D:
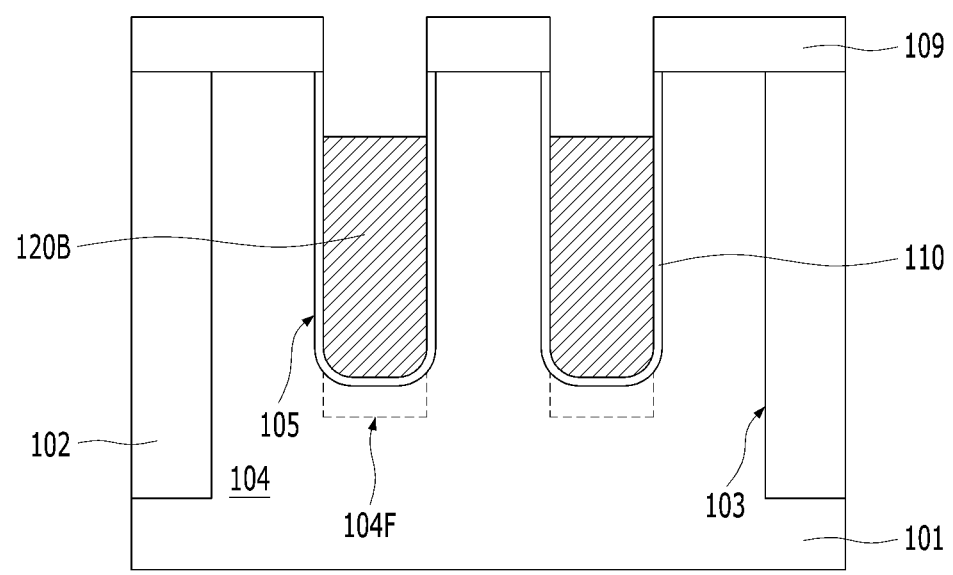

Referring to FIG. 4D, an initial gate electrode 120B may be formed by performing a recessing process on the gate layer 120A.

In an embodiment, the recessing process may include a dry etch process, for example, an etch-back process. The etch-back process may be performed using plasma. In another process, the recessing process may be performed first to expose the top surface of the hard mask layer 109, and then the etch-back process of the recessing process may be performed on the gate layer 102A.

The top surface of the initial gate electrode 120B may be recessed at a lower level than the top surface of the active region 104. After the initial gate electrode 120B is formed, a part of the surface of the gate dielectric layer 110 may be exposed.

Figure 4E:
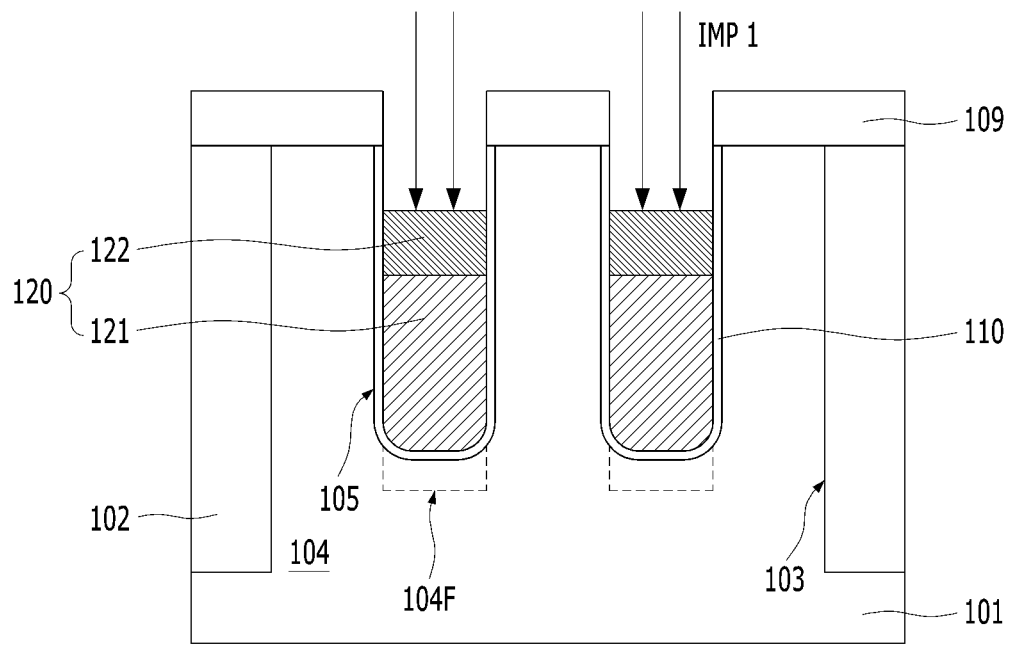

Referring to FIG. 4E, dopants may be incorporated into an upper portion of the initial gate electrode 120B by performing a first ion implantation process (IMP1). As a result, after the first ion implantation process (IMP1), the initial gate electrode 120B may be converted into a gate electrode 120 including a first portion 121 on a lower portion and a second portion 122 on an upper portion. The upper portion of the initial gate electrode 120B may be converted into the second portion 122 by incorporating dopants through the first ion implantation process (IMP1). After the first ion implantation process (IMP1), the lower portion of the initial gate electrode 120B, where the first ion implantation process (IMP1) is not performed, may be referred to as the first portion 121 of the gate electrode 120. That is, the first portion 121 of the gate electrode 120 does not include any dopants doped by the first ion implantation process (IMP1).

The first ion implantation process (IMP1) may be performed under the condition that the dopants can be incorporated only in the upper portion of the initial gate electrode 120B.

The first ion implantation process (IMP1) may be performed by a perpendicular ion implantation in which ions are introduced perpendicularly to a top surface of the initial gate electrode 120B.

In accordance with the embodiment, it is possible to decrease a work function of the upper portion of the initial gate electrode 120B by the first ion implantation process (IMP1).

The dopants incorporated by the first ion implantation process (IMP1) may include elements which can decrease a work function of the second portion 122. In an embodiment, the dopants incorporated by first ion implantation process (IMP1) to modulate a work function may include phosphorous (P), germanium (Ge), or a combination thereof.

The first portion 121 may have a height greater than that of the second portion 122. Therefore, the first portion 121 may occupy a larger volume that the second portion 122 in the gate trench 105. The first portion 121 and the second portion 122 may have sidewalls aligned with each other. Therefore, the first portion 121 may have the same width as the second portion 122.

The gate electrode 120 may include the first portion 121 at the lower portion and the second portion 122 at the upper portion. The first portion 121 may not have dopants, and the second portion 122 may have dopants doped by the ion implantation in the upper portion of the initial gate electrode 120B. Accordingly, it is possible to reduce a work function of the second portion 122 together with maintaining a work function of the first portion 121.

Figure 4F:
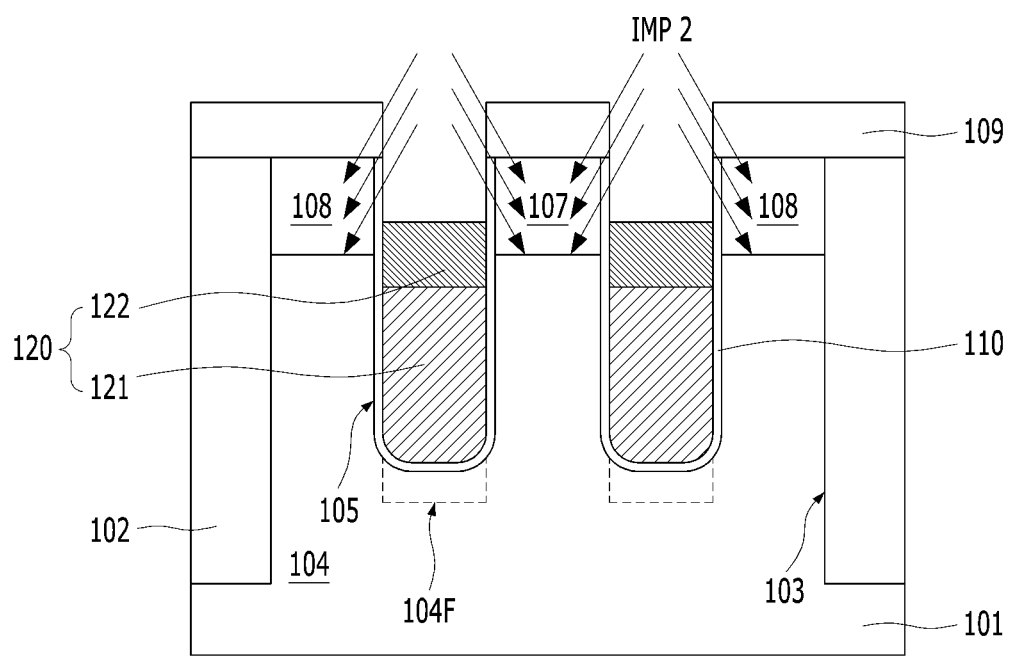

Referring to FIG. 4F, a first doped region 107 and a second doped region 108 may be formed by performing a second ion implantation process (IMP2) in the active regions 104 on both sides of the gate trench 105.

As the first and second doped regions 107 and 108 are formed, a channel (refer to reference numeral "106" of FIG. 2A) may be defined along the surface of the gate trench 105.

The second ion implantation process (IMP2) may be performed under the condition that lower surfaces of the first and second doped regions 107 and 108 are located at a given depth from top surfaces of the active regions 104 on both sides of the gate trench 105.

The second ion implantation process (IMP2) may be performed by a tilted ion implantation. A tilt angle of the tilted ion implantation process may be adjusted so that the first and second doped regions 107 and 108 are formed at a given depth from the top surfaces of the active regions 104.

In an embodiment, the second ion implantation process (IMP2) may be performed so that the first and second doped regions 107 and 108 laterally overlap with all the second portion 122 and does not laterally overlap with the first portion 121.

In another embodiment, the second ion implantation process (IMP2) may be performed so that the first and second doped regions 107 and 108 laterally overlap with a part of the second portion 122 and does not overlap with the first portion 121.

The dopants incorporated by the second ion implantation process (IMP2) may include phosphorous (P), arsenic (As), or a combination thereof.

In an embodiment, the dopants incorporated by the second ion implantation process (IMP2) may be the same as those incorporated by the first ion implantation process (IMP1). For example, the dopants incorporated by the first ion implantation process (IMP1) and the second ion implantation process (IMP2) may include phosphorous (P), respectively.

In another embodiment, the dopants incorporated by the second ion implantation process (IMP2) may be different from those incorporated by the first ion implantation process (IMP1). For example, the dopants incorporated by the first ion implantation process (IMP1) may include phosphorous (P), while the dopants incorporated by the second ion implantation process (IMP2) may include arsenic (As). For another example, the dopants incorporated by the first ion implantation process (IMP1) may include germanium (Ge), while the dopants incorporated by the second ion implantation process (IMP2) may include phosphorous (P). For another example, the dopants incorporated by the first ion implantation process (IMP1) may include germanium (Ge), while the dopants incorporated by the second ion implantation process (IMP2) may include arsenic (As).

The first and second doped regions 107 and 108 may be positioned at a level higher than a bottom surface of the gate trench 105. The first and second doped regions 107 and 108 may be in contact with sidewalls of the gate trench 105. The first and second doped regions 107 and 108 may form junctions of the same depth as each other.

In an embodiment, lower surfaces of the first and second doped regions 107 and 108 may be positioned at the same level as a lower surface of the second portion 122. That is, the second portion 122 of the gate electrode 120 may entirely overlap with the first and second doped regions 107 and 108, while the first portion 121 may not overlap with the first and second doped regions 107 and 108.

In another embodiment, lower surfaces of the first and second doped regions 107 and 108 may be positioned at a level lower than an upper surface of the second portion 122. That is, a part of the second portion 122 of the gate electrode 120 may overlap with the first and second doped regions 107 and 108 and the remaining part of the second portion 122 of the gate electrode 120 may overlap with channel region 106. The first portion 121 may not overlap with the first and second doped regions 107 and 108.

In accordance with the embodiment, it is possible to decrease only a work function of the upper portion of the initial gate electrode 120B by the first ion implantation process (IMP1) and form the junction region at a given height by the second ion implantation process (IMP2). Therefore, the first and second doped regions 107 and 108 may not overlap with the first portion 121 having a high work function. Since the second portion 122 in contact with the first and second doped regions 107 and 108 has a reduced work function, it is possible to avoid a gate induced drain leakage (GIDL) and improve refresh characteristics.

In the embodiment shown in FIGS. 4E and 4F, the first ion implantation process (IMP1) is performed and then the second ion implantation process (IMP2) is performed. In another embodiment, the first ion implantation process (IMP1) and the second ion implantation process (IMP2) may be simultaneously performed.

Figure 4G:
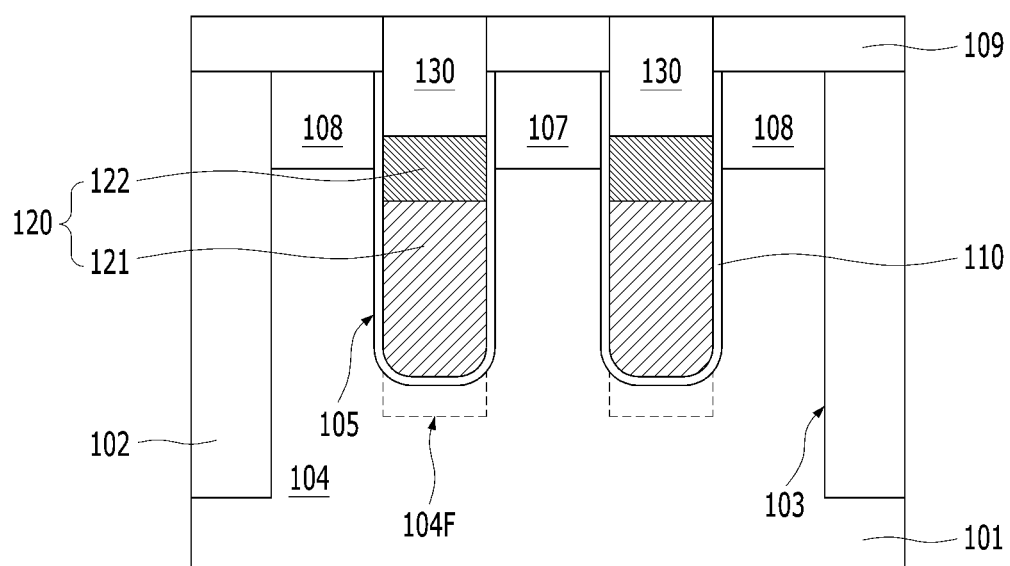

Referring to FIG. 4G, a capping layer 130 may be formed on the second portion 122 of the gate electrode 120. The capping layer 130 may include a dielectric material. The capping layer 130 may include silicon nitride, silicon oxynitride, or a combination thereof. In another embodiment, the capping layer 130 may include a combination of silicon nitride and silicon oxide. The capping layer 130 may have a multi-layered structure such as an oxide-nitride-oxide (ONO) structure.

Subsequently, a planarization process may be performed on the capping layer 130 to expose the top surface of the hard mask layer 109. Accordingly, the capping layer 130 filling the gate trench 105 may remain.

The bottom surface of the capping layer 130 may be in contact with the second portion 122. Both sidewalls of the capping layer 130 may be in contact with the gate dielectric layer 106 and the hard mask layer 109.

According to the processes described above, a buried gate structure may be formed. The buried gate structure may include the gate dielectric layer 110, the gate electrode 120 and the capping layer 130. The gate electrode 120 may include the first portion 121 filling the gate trench 105 and having a work function without modulation and the second portion 122 filling the gate trench 105 on the first portion 121 and having a modulated work function. A work function of the first portion 121 can be adjusted to be lower than that of the second portion 122 by the ion implantation. The first portion 121 of the gate electrode 120 may not overlap with the first and second doped regions 107 and 108.

FIGS. 5A to 5G are cross-sectional views illustrating another example of a method for forming the semiconductor device illustrated in FIG. 2A. The method shown in FIGS. 5A to 5G is similar to the method shown in FIGS. 4A to 4G, except for forming the first and second doped regions 107 and 108. Therefore, in order to avoid repetition, a detailed description similar to the method of FIGS. 4A to 4G may be omitted.

Figure 5A:
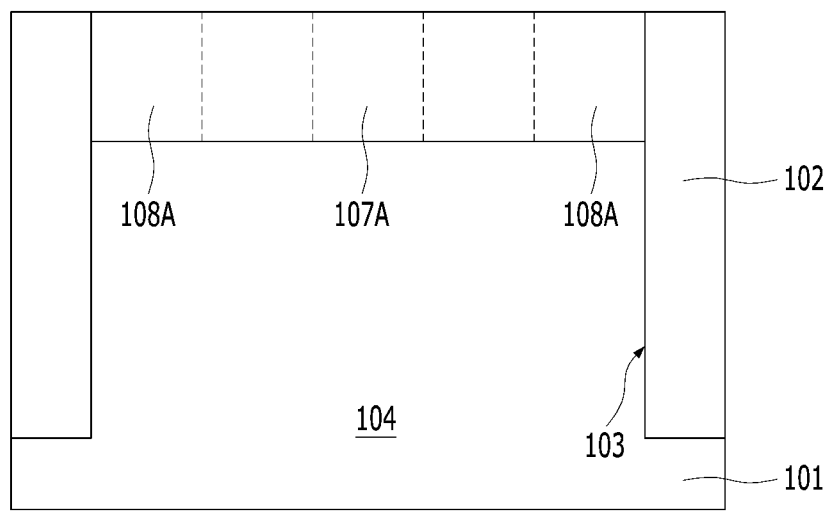
FIGS. 5A to 5G are cross-sectional views illustrating another example of a method for forming the semiconductor device illustrated in FIG. 2A.

Referring to FIG. 5A, an isolation layer 102 may be formed in a substrate 101 to define an active region 104. The isolation layer 102 may be formed using a shallow trench isolation (STI) process. The isolation layer 102 may include silicon oxide, silicon nitride or a combination thereof.

Subsequently, a first preliminary doped region 107A and a second preliminary second preliminary doped region 108A may be formed on the active region 104.

The first preliminary doped region 107A and the second preliminary doped region 108A may referred to as regions separated from each other by a gate trench (referring to reference numerical 105) during a subsequent process to form the first and second doped regions 107 and 108.

The first preliminary doped region 107A and the second preliminary doped region 108A may be doped with dopants. In an embodiment, the dopants incorporated in the first preliminary doped region 107A and the second preliminary doped region 108A may be the same as each other. In another embodiment, the dopants incorporated in the first preliminary doped region 107A and the second preliminary doped region 108A may be different from each other.

The dopants incorporated in the first preliminary doped region 107A and the second preliminary doped region 108A may include phosphorous (P), arsenic (As), or a combination thereof.

The first preliminary doped region 107A and the second preliminary doped region 108A may be formed at the same depth as each other.

Figure 5B:
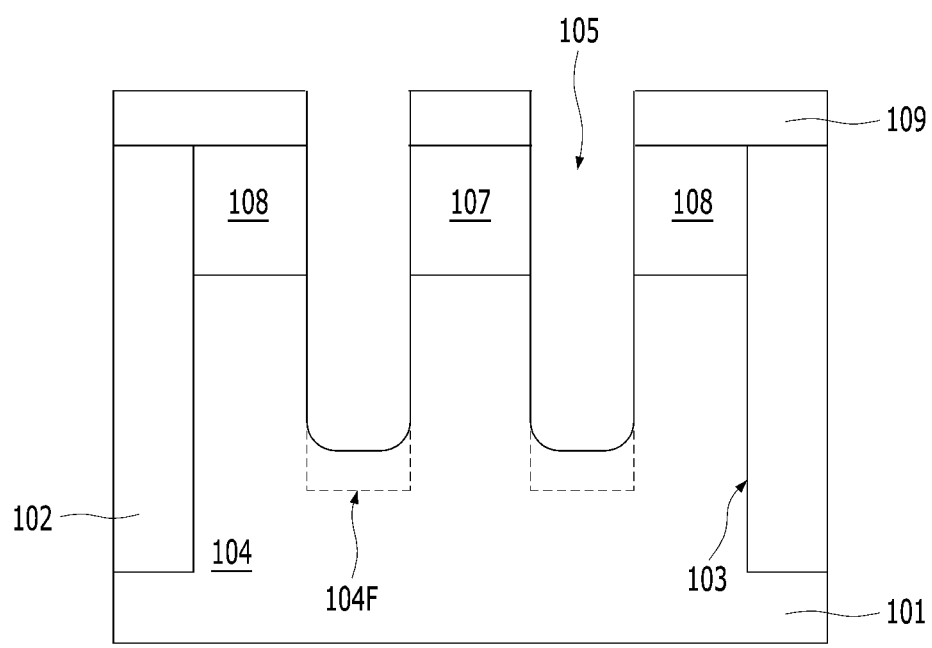

Referring to FIG. 5B, the hard mask layer 109 may be formed on the substrate 101.

The hard mask layer 109 may be formed of a material having an etch selectivity with respect to the material of the substrate 101. The hard mask layer 109 may include a silicon oxide, such as Tetra-Ethyl-Ortho-Silicate (TEOS).

Subsequently, a gate trench 105 may be formed in the substrate 101.

The gate trench 105 may be formed by etching the substrate 101 using the hard mask layer 109 as an etch mask.

Then, a fin region 104F may be formed by selectively recessing the isolation layer 102 below the gate trench 105.

The first and second doped regions 107 and 108 may be formed by separating the first preliminary doped region 107A and the second preliminary doped region 108A by the gate trench 105. The first and second doped regions 107 and 108 may be formed at the same depth as each other.

Figure 5C:
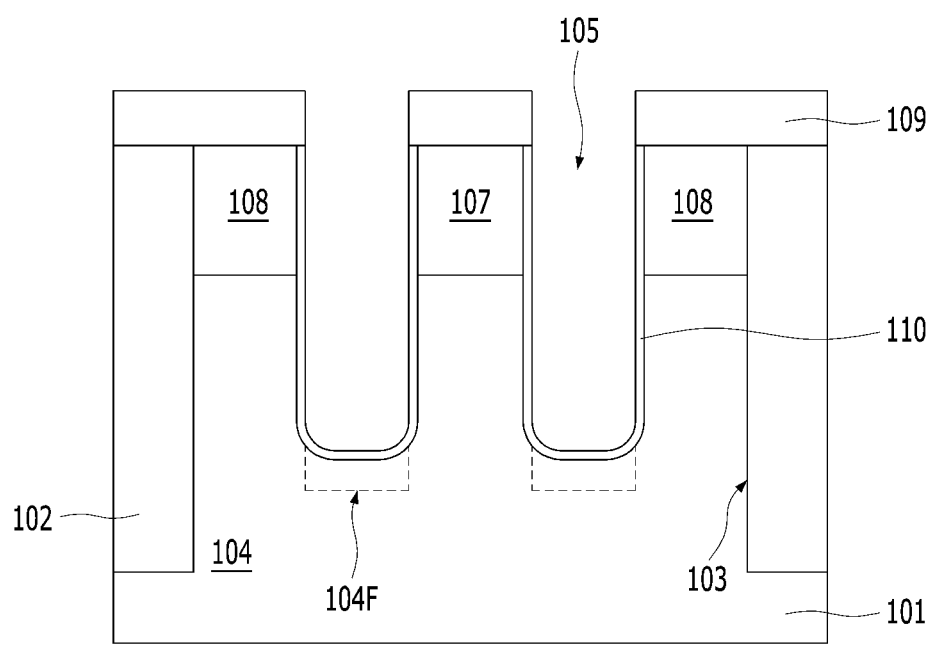

Referring to FIG. 5C, a gate dielectric layer 110 may be formed directly on the surface of the gate trench 105 to conformally cover the entire surface (bottom and sidewalls) of the gate trench 105.

Before the gate dielectric layer 110 is formed, the surface of the gate trench 105 that is damaged from the etch process may be recovered. For example, sacrificial oxide may be formed by a thermal oxidation treatment, and then the sacrificial oxide may be removed.

The gate dielectric layer 110 may be formed by a thermal oxidation process, a radical oxidation process, a chemical vapor deposition (CVD) process or an atomic layer deposition (ALD) process.

The gate dielectric layer 110 may include oxide, nitride, oxynitride, a high-k material, or a combination thereof. The gate dielectric layer 110 may include a stack of silicon oxide and a high-k material.

Figure 5D:
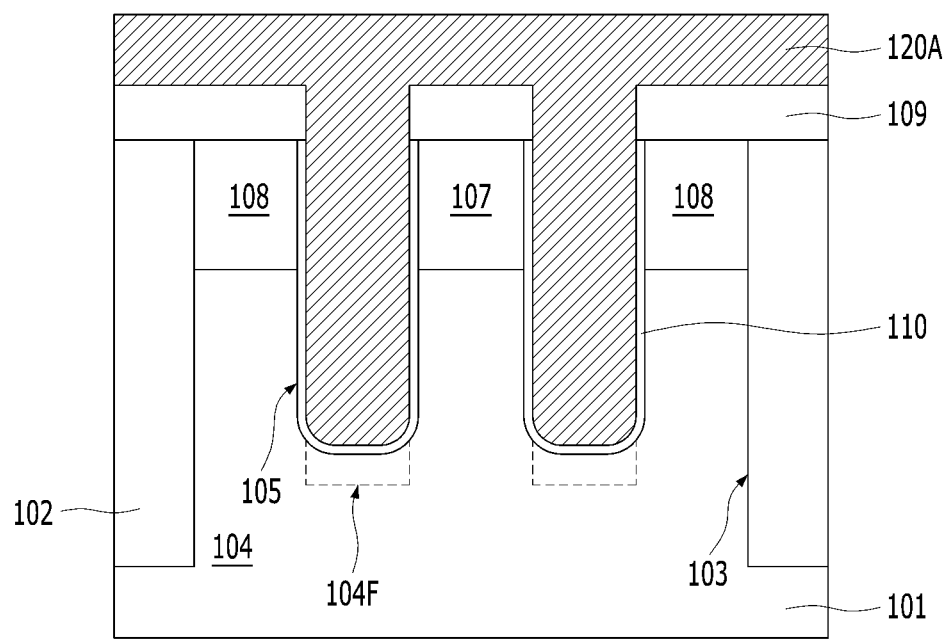

Referring to FIG. 5D, a gate layer 120A may be formed to cover the structure of FIG. 5C. That is, the gate layer 120A may be formed on the gate dielectric layer 110 and the hard mask layer 109.

The gate layer 120A may fill the gate trench 105 and be in direct contact with the gate dielectric layer 110. The gate layer 120A may be formed by a deposition method including, for example, CVD or ALD. The gate layer 120A may be made of or include a low resistivity metal material. The gate layer 120A may include a metal, metal nitride, metal silicide, or a combination thereof. The gate layer 120A may include tantalum nitride (TaN), titanium nitride (TiN), tungsten (W), aluminum (Al), tungsten nitride (WN), tungsten silicide (WSi$_x$), cobalt silicide (CoSi$_x$), titanium silicide (TiSi$_x$), or a combination thereof. In an embodiment, the gate layer 120A may be formed of titanium nitride (TiN) alone.

Figure 5E:
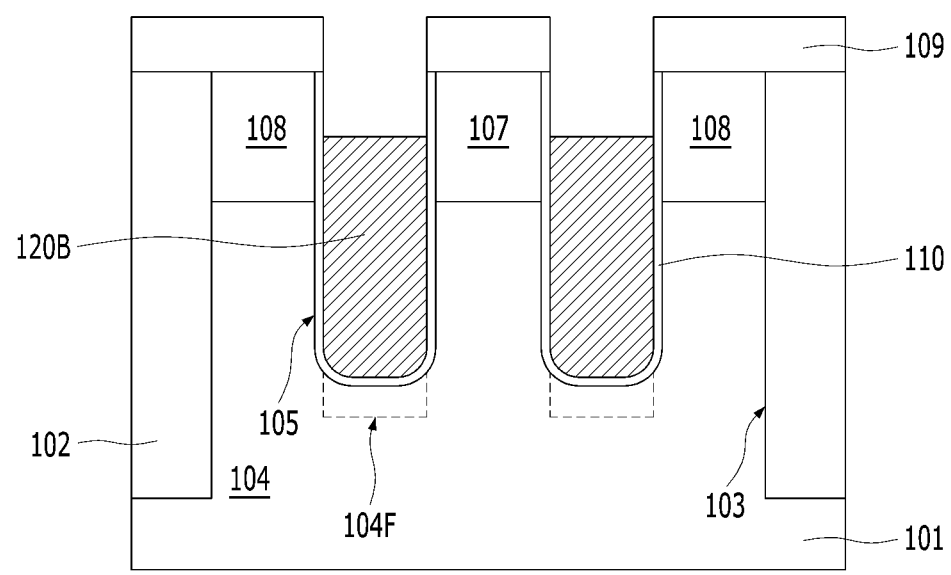

Referring to FIG. 5E, an initial gate electrode 120B may be formed by performing a recessing process on the gate layer 120A.

In an embodiment, the recessing process may include a dry etch process, for example, an etch-back process. The top surface of the initial gate electrode 120B may be recessed at a lower level than the top surface of the active region 104. After the initial gate electrode 120B is formed, a part of the surface of the gate dielectric layer 110 may be exposed.

Figure 5F:
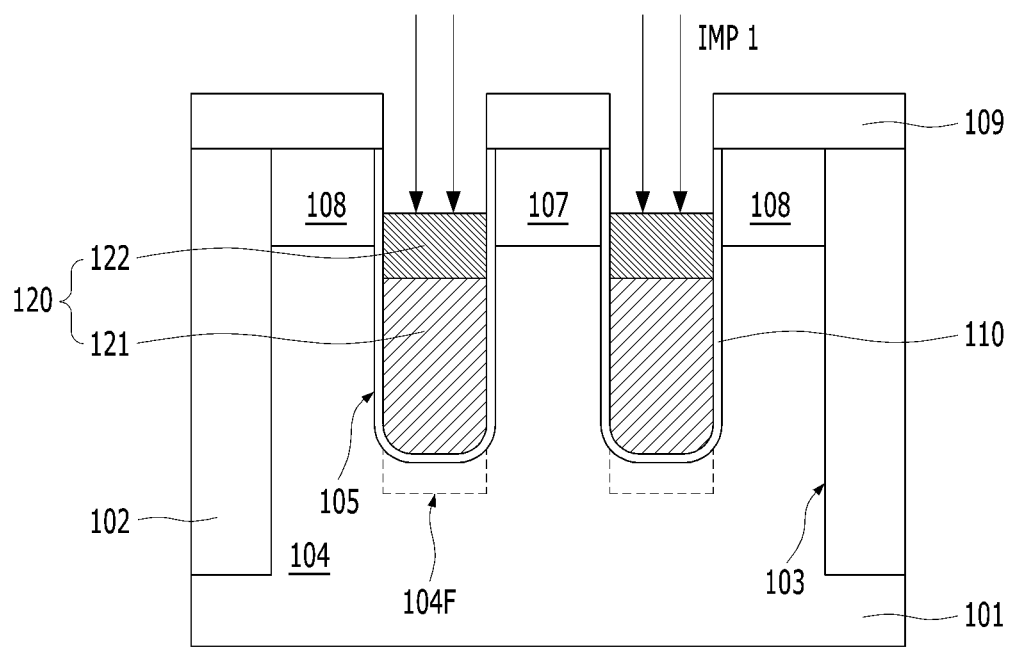

Referring to FIG. 5F, as a result, after the first ion implantation process (IMP1), the initial gate electrode 120B may be converted into a gate electrode 120 including a first portion 121 on a lower portion and a second portion 122 on an upper portion. The upper portion of the initial gate electrode 120B may be converted into the second portion 122 by incorporating dopants through the first ion implantation process (IMP1). After the first ion implantation process (IMP1), the lower portion of the initial gate electrode 120B, where the first ion implantation process (IMP1) is not performed, may be referred to as the first portion 121 the gate electrode 120. That is, the first portion 121 of the gate electrode 120 does not include the dopants doped by the first ion implantation process (IMP1).

The first ion implantation process (IMP1) may be performed under the condition that the dopants can be incorporated only in the upper portion of the initial gate electrode 120B.

The dopants incorporated by the first ion implantation process (IMP1) may include elements which can decrease a work function of the second portion 122. In an embodiment, the dopants incorporated by first ion implantation process (IMP1) to modulate a work function may include phosphorous (P), germanium (Ge), or a combination thereof.

The gate electrode 120 may include the first portion 121 at the lower portion and the second portion 122 at the upper portion. The first portion 121 may not have dopants, and the second portion 122 may have dopants doped by the ion implantation in the upper portion of the initial gate electrode 120B. Accordingly, it is possible to reduce a work function of the second portion 122 together with maintaining a work function of the first portion 121.

Figure 5G:
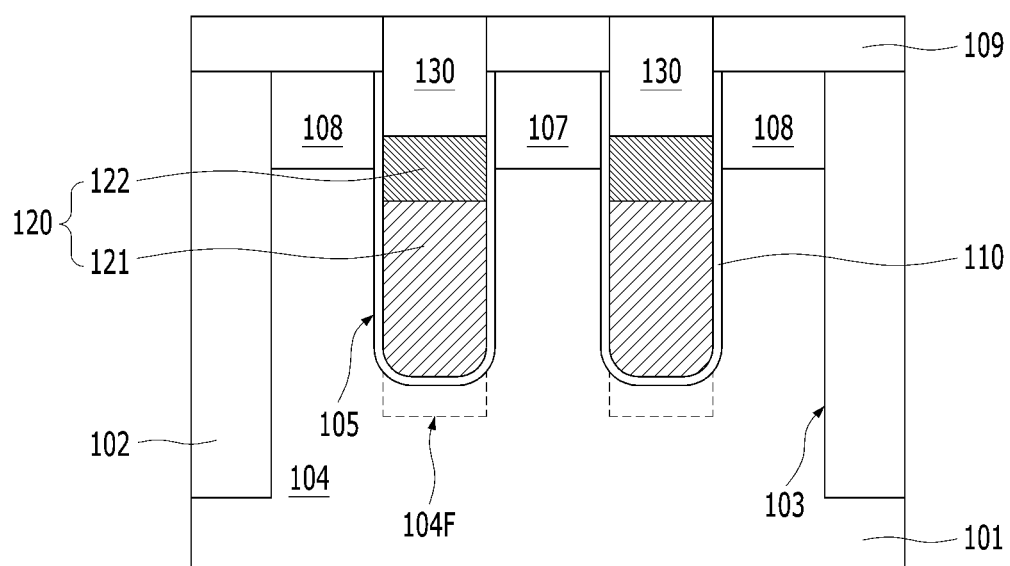

Referring to FIG. 5G, a capping layer 130 may be formed on the second portion 122 of the gate electrode 120. The capping layer 130 may include a dielectric material. The capping layer 130 may include silicon nitride, silicon oxynitride, or a combination thereof.

Subsequently, a planarization process may be performed on the capping layer 130 to expose the top surface of the hard mask layer 109. Accordingly, the capping layer 130 filling the gate trench 105 may remain.

According to the processes described above, a buried gate structure may be formed. The buried gate structure may include the gate dielectric layer 110, the gate electrode 120 and the capping layer 130. The gate electrode 120 may include the first portion 121 filling the gate trench 105 and having a work function without modulation and the second portion 122 filling the gate trench 105 on the first portion 121 and having a modulated work function. A work function of the first portion 121 can be adjusted to be lower than that of the second portion 122 by the ion implantation. The first portion 121 of the gate electrode 120 may not overlap with the first and second doped regions 107 and 108. In an embodiment, all the second portion 122 of the gate electrode 120 may overlap with the first and the second doped regions 107 and 108. In another embodiment, a part of the second portion 122 of the gate electrode 120 may overlap with the first and the second doped regions 107 and 108.

Figure 6A:
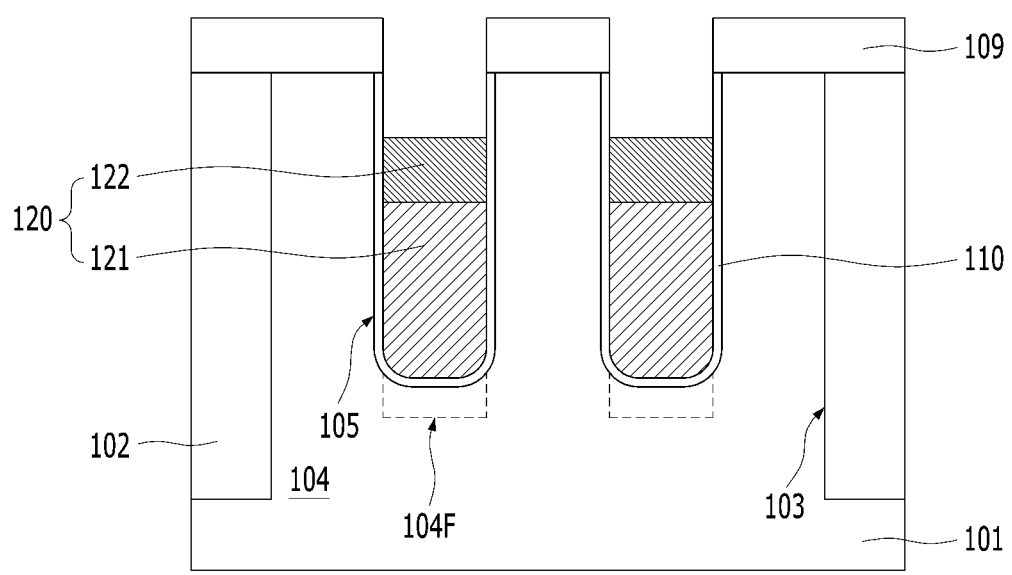
FIGS. 6A to 6C are cross-sectional views illustrating still another example of a method for forming the semiconductor device illustrated in FIG. 2A.
Figure 6B:
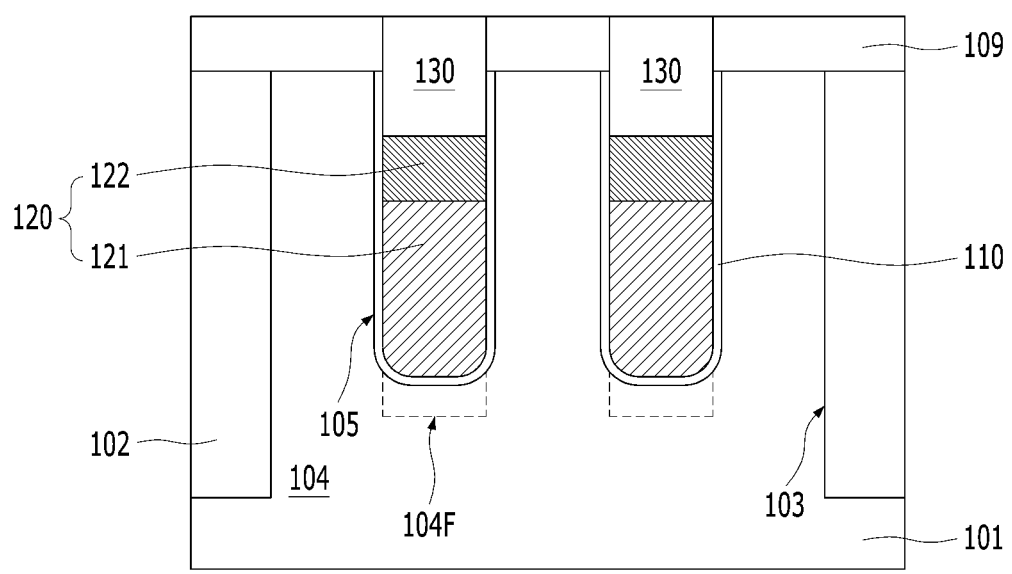
Figure 6C:
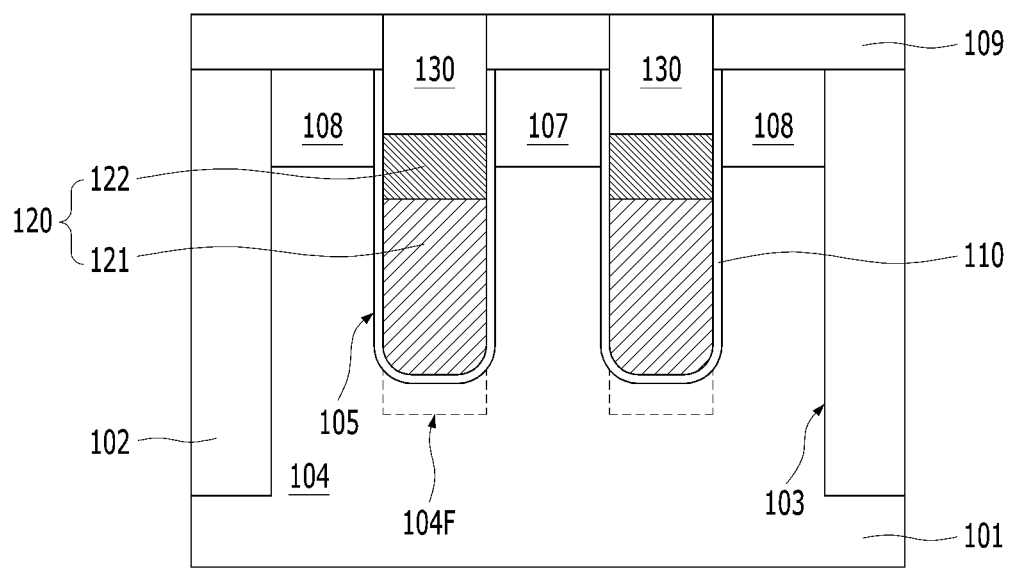

FIGS. 6A to 6C are cross-sectional views illustrating another example of a method for forming the semiconductor device illustrated in FIG. 2A. The method shown in FIGS. 6A to 6C is similar to the method shown in FIGS. 4A to 4G, except for forming the first and second doped regions 107 and 108. Therefore, in order to avoid repetition, a detailed description similar to the method of FIGS. 4A to 4G may be omitted.

Referring to FIG. 6A, a gate electrode 120 including a first portion 121 and a second portion 122 may be formed in a gate trench 105 by a similar process to that shown in FIGS. 4A to 4E.

Referring to FIG. 6B, a capping layer 130 may be formed on the second portion 122 of the gate electrode 120. The capping layer 130 may include a dielectric material. The capping layer 130 may include silicon nitride, silicon oxynitride, or a combination thereof.

Subsequently, a planarization process may be performed on the capping layer 130 to expose the top surface of the hard mask layer 109. Accordingly, the capping layer 130 filling the gate trench 105 may remain.

Referring to FIG. 6C, dopants may be incorporated in active regions 104 on both sides of the gate trench 105 in order to form source and drain regions. As a result, a first doped region 107 and a second doped region 108 may be formed in the substrate 101.

In an embodiment, the first and second doped regions 107 and 108 may have a depth which laterally overlaps with the second portion 122 of the gate electrode 120. The first portion 121 of the gate electrode 120 may not be laterally overlapping with the first and second doped regions 107 and 108.

In another embodiment, the first and second doped regions 107 and 108 may have a depth which laterally overlaps with a part of the second portion 122 of the gate electrode 120. The first portion 121 of the gate electrode 120 may not be laterally overlapping with the first and second doped regions 107 and 108.

According to the processes described above, a buried gate structure may be formed. The buried gate structure may include the gate dielectric layer 110, the gate electrode 120 and the capping layer 130. The gate electrode 120 may include the first portion 121 filling the gate trench 105 and having a work function without modulation and the second region 122 filling the gate trench 105 on the first portion 121 and having a modulated work function. A work function of the first portion 121 can be adjusted to be lower than that of the second region 122 by the ion implantation. The first portion 121 of the gate electrode 120 may not overlap with the first and second doped regions 107 and 108. In an embodiment, all the second portion 122 of the gate electrode 120 may overlap with the first and the second doped regions 107 and 108. In another embodiment, a part of the second portion 122 of the gate electrode 120 may overlap with the first and the second doped regions 107 and 108.

Figure 7:
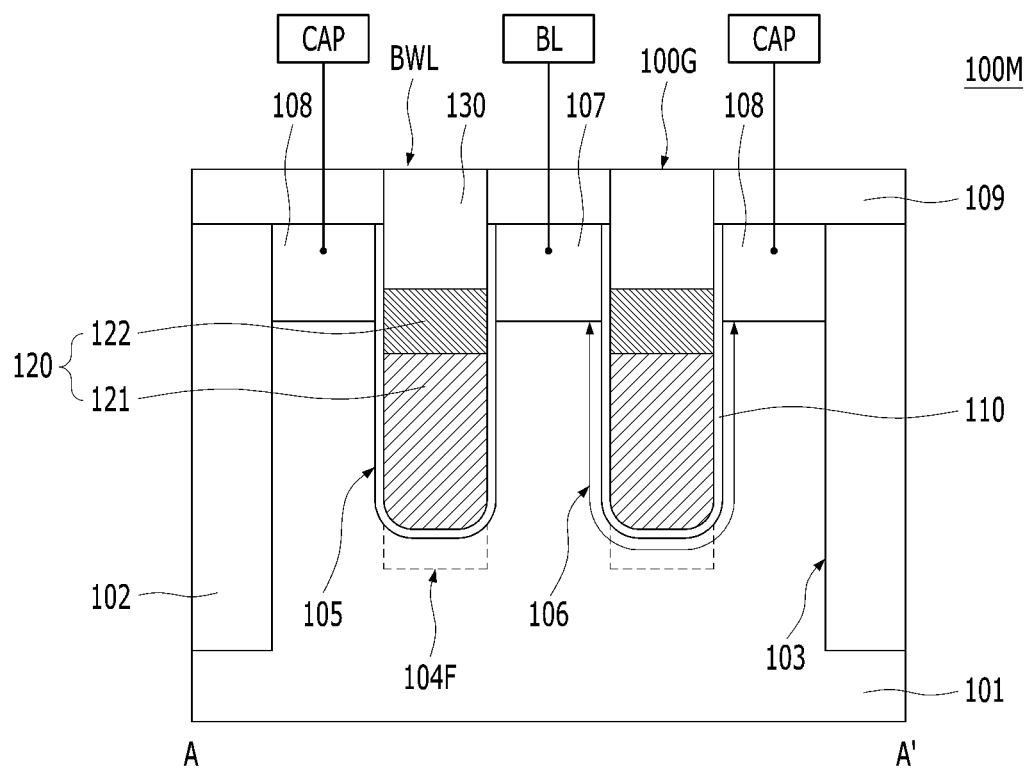
FIG. 7 is a cross-sectional view illustrating a memory cell, according to an embodiment of the present invention.

FIG. 7 is a cross-sectional view illustrating a memory cell 100M.

Referring to FIG. 7, the memory cell 100M may include a cell transistor, a bit line BL and a capacitor CAP. The cell transistor may include the semiconductor device 100 of FIG. 2A. Accordingly, the cell transistor may include a buried gate structure 100G, a channel region 106, and first and second doped regions 107 and 108. The first doped region 107 may be electrically connected to the bit line BL. The second doped region 108 may be electrically connected to the capacitor CAP.

In the memory cell 100M, the buried gate structure BWL may be referred to as a buried word line structure BWL. The buried word line structure BWL may be embedded in a gate trench 105. The buried word line structure BWL may include a gate dielectric layer 110, a gate electrode 120 and a capping layer 130. The gate electrode 120 may include a first portion 121 and a second portion 122.

The buried word line structure BWL may be replaced with any one of the buried gate structures in accordance with the above-described embodiments.

The capacitor CAP may include a storage node, a dielectric layer and a plate node. The storage node may have a cylindrical shape or a pillar shape. The dielectric layer may be formed on the surface of the storage node. The dielectric layer may be or include at least one selected from zirconium oxide, aluminum oxide and hafnium oxide. For example, the dielectric layer may have a ZAZ ($ZrO_2/Al_2O_3/ZrO_2$) structure where first zirconium oxide, aluminum oxide and second zirconium oxide are stacked. The plate node is formed on the dielectric layer. The storage node and the plate node may be made of or include a metal-containing material.

The memory cell 100M may be a part of a Dynamic Random-Access Memory (DRAM). When the memory cell 100M is applied to the DRAM, a gate induced drain leakage (GIDL) can be prevented and refresh characteristics of the DRAM can be improved. Further, process distribution can be improved, thereby enhancing process efficiency.

While the present invention has been described with respect to specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:
1. A semiconductor device, comprising:
a substrate including an active region defined by an isolation layer;
a buried gate structure provided in a trench formed in the substrate; and a first doped region and a second doped region formed in the active region and separated by the trench, wherein the buried gate structure comprises:

a gate dielectric layer conformally covering the trench; and a gate electrode including a first portion partially filling the trench on the gate dielectric layer and a second portion formed on the first portion, wherein the second portion comprises a material included in the first portion and dopants including phosphorous (P), germanium (Ge), or a combination thereof, wherein the first portion does not laterally overlap with the first doped region and the second doped region, and all or a part of the second portion laterally overlaps with the first doped region and the second doped region, and wherein sidewalls of the first and the second portions are aligned with each other, and the first portion has a height greater than that of the second portion.

2. The device of claim 1, wherein the first doped region and the second doped region have dopants including phosphorous (P), arsenic (As), or a combination thereof.

3. The device of claim 1, wherein the first doped region and the second doped region have the same dopant as each other.

4. The device of claim 1, wherein the first doped region and the second doped region have different dopants from each other.

5. The device of claim 1, wherein the first and the second portions have metal, metal nitride, metal silicide, or a combination thereof.

6. The device of claim 1, wherein the second portion has a work function lower than that of the first portion.

7. A method for fabricating a semiconductor device comprising:

forming a trench in a substrate including an active region defined by an isolation layer;

forming a gate dielectric layer covering the trench;

forming an initial gate electrode partially filling the trench on the gate dielectric layer;

forming a gate electrode including a first portion and a second portion; and forming a first doped region and a second doped region on both sides of the trench, wherein the second portion differs from the first portion in that only the second portion includes at least one dopant, and wherein sidewalls of the first and the second portions are aligned with each other, and the first portion has a height greater than that of the second portion.

8. The method of claim 7, wherein the second portion of the gate electrode is formed by performing a first ion implantation process using at least one dopant selected from a group including phosphorous (P), and germanium (Ge).

9. The method of claim 8, wherein the first ion implantation process includes perpendicular ion implantation of the at least one dopant into the second portion of the gate electrode.

10. The method of claim 8, wherein the forming of the first and second doped regions includes a second ion implantation process performed by using at least one dopant selected from a group including phosphorous (P), and arsenic (As).

11. The method of claim 10, wherein the second ion implantation process includes a tilted ion implantation process.

12. The method of claim 11, wherein a tilt angle of the second ion implantation process is adjusted so that the first doped region and the second doped region do not laterally overlap with the first portion and overlap only with all or a part of the second portion.

13. The method of claim 10, wherein the first and the second ion implantation processes are simultaneously performed.

14. The method of claim 10, wherein the second ion implantation process is performed after the first ion implantation process.

15. The method of claim 10, wherein the first and the second ion implantation processes are performed by using the same at least one dopant.

16. The method of claim 10, wherein the first and the second ion implantation processes are performed by using a different at least one dopant from each other.

17. The method of claim 7, wherein a lower surface of the second portion is positioned at the same level as lower surfaces of the first and the second doped regions.

18. The method of claim 7, wherein an upper surface of the second portion is positioned at a level higher than lower surfaces of the first and the second doped regions, and a lower surface of the second portion is positioned as a level lower than lower surfaces of the first and the second doped regions.

19. The method of claim 7, wherein the initial gate electrode is formed of a metal, metal nitride, metal silicide, or a combination thereof, and the first portion includes a material included in the initial gate electrode and the second portion includes the material included in the initial gate electrode and dopants for modulating a work function.

* * * * *